United States Patent

Powell et al.

[11] Patent Number: 6,037,241
[45] Date of Patent: *Mar. 14, 2000

[54] APPARATUS AND METHOD FOR DEPOSITING A SEMICONDUCTOR MATERIAL

[75] Inventors: Ricky C. Powell, Ypsilanti, Mich.; Gary L. Dorer, Taunton, Mass.; Nicholas A. Reiter, Gibsonburg, Ohio; Harold A. McMaster, Perrysburg, Ohio; Steven M. Cox, Whitehouse, Ohio; Terence D. Kahle, Perrysburg, Ohio

[73] Assignee: First Solar, LLC, Toledo, Ohio

[*] Notice: This patent is subject to a terminal disclaimer.

[21] Appl. No.: 09/026,139

[22] Filed: Feb. 19, 1998

[51] Int. Cl.$^7$ .................................................. C23C 16/00
[52] U.S. Cl. .............. 438/479; 427/255.23; 427/255.11; 427/248.1; 118/718; 118/724; 118/726; 118/729; 392/386; 392/387; 438/758; 438/149
[58] Field of Search ..................................... 118/718, 724, 118/726, 729; 392/386, 387; 427/255, 255.1, 255.11, 255.23, 248.1; 438/758, 149, 479

[56] References Cited

U.S. PATENT DOCUMENTS

| | | | |
|---|---|---|---|
| 4,083,708 | 4/1978 | Heath et al. ................................. | 65/23 |
| 4,401,052 | 8/1983 | Baron et al. . | |
| 4,947,790 | 8/1990 | Gartner et al. ........................... | 118/715 |
| 4,997,677 | 3/1991 | Wang et al. ........................... | 427/248.1 |
| 5,071,678 | 12/1991 | Grybowski et al. ..................... | 427/253 |
| 5,182,567 | 1/1993 | Wilder ..................................... | 392/389 |
| 5,204,314 | 4/1993 | Kirlin et al. ................................. | 505/1 |
| 5,248,349 | 9/1993 | Foote et al. . | |
| 5,372,646 | 12/1994 | Foote et al. . | |
| 5,372,648 | 12/1994 | Yamamoto et al. ................. | 118/723 E |
| 5,470,397 | 11/1995 | Foote et al. . | |
| 5,536,333 | 7/1996 | Foote et al. . | |
| 5,596,673 | 1/1997 | Ward et al. .............................. | 392/389 |
| 5,626,677 | 5/1997 | Shirahata ................................ | 118/719 |
| 5,807,615 | 9/1998 | Sindzingre et al. ..................... | 427/562 |
| 5,835,687 | 11/1998 | Li et al. .................................. | 392/401 |
| 5,882,416 | 3/1999 | Van Buskirk et al. .................. | 118/726 |
| 5,945,163 | 8/1999 | Powell et al. .......................... | 427/255.1 |

Primary Examiner—Jeffrie R Lund
Attorney, Agent, or Firm—Brooks & Kushman P.C.

[57] ABSTRACT

Apparatus (12, 12a) and a method for depositing a semiconductor material on a glass sheet substrate (G) utilizes a distributor (22) including a heated permeable member (24) through which a carrier gas and a semiconductor material are passed to provide a vapor that is deposited as a semiconductor layer on the conveyed glass sheet substrate. The permeable member (24) is tubular and has an electrical voltage applied along its length to provide the heating, and the carrier gas and the semiconductor as a powder are introduced into the tubular permeable member for flow outwardly therefrom as the vapor. A shroud (34) extending around the tubular permeable member (24) has an opening (36) through which the vapor flows for the semiconductor layer deposition. In one embodiment of apparatus (12), the semiconductor layer is deposited on an upwardly facing surface (56) of the glass sheet substrate (G) while another embodiment of the apparatus (12a) deposits the semiconductor layer on a downwardly facing surface (54) of the substrate.

32 Claims, 2 Drawing Sheets

APPARATUS AND METHOD FOR DEPOSITING A SEMICONDUCTOR MATERIAL

TECHNICAL FIELD

This invention relates to apparatus and a method for depositing a semiconductor material on a glass sheet substrate.

BACKGROUND ART

The United States Patents of Foote et al. U.S. Pat. Nos. 5,248,349, 5,372,646, 5,470,397 and 5,536,333, which are assigned to the assignee of the present invention and the entire disclosure of which is hereby incorporated by reference, disclose a continuous process for deposition of semiconductor material as a layer of cadmium telluride on a glass sheet substrate. The Foote et al. patents disclose source material troughs in which the cadmium telluride is received within a processing chamber that is heated. Glass sheet substrates are conveyed below the source material troughs such that sublimation of the source material from the troughs produces deposition of the semiconductor material on the upwardly facing surface of the conveyed glass sheets in a continuous manner. This construction requires that the source material troughs be periodically replenished with the cadmium telluride that provides the semiconductor material. The Foote et al. patent also disclose introduction of the source material as a vapor from sources of elemental cadmium and tellurium or from a source of cadmium telluride.

DISCLOSURE OF INVENTION

One object of the present invention is to provide improved apparatus for depositing a semiconductor material on a glass sheet substrate.

In carrying out the above object, the apparatus of the invention includes a heated permeable member and also includes a material supply for supplying a carrier gas and the semiconductor material for flow through the heated permeable member and passage therefrom as a vapor. A conveyor of the apparatus conveys a glass sheet substrate adjacent the permeable member for deposition of the vapor on the substrate as a semiconductor layer.

The preferred construction of the apparatus has the heated permeable member constructed with a tubular shape into which the material supply introduces the carrier gas and the semiconductor material for flow outwardly therefrom as the vapor that is deposited on the glass sheet substrate as the semiconductor layer. This tubular permeable member has opposite ends across which an electrical voltage is applied to provide its heating. Furthermore, the tubular permeable member is made of silicon carbide.

The preferred construction of the apparatus also includes a shroud of a generally tubular shape that receives the tubular permeable member. This shroud has an opening through which the vapor passes for the deposition of the semiconductor layer on the glass sheet substrate. Most preferably, the opening of the shroud is a slit that extends along the tubular shape of the shroud. The shroud may have opposite ends between which the slit has a varying size to control the distribution of the vapor deposition onto the glass sheet substrate. Furthermore, the shroud is preferably made of a ceramic material that is disclosed as being mullite.

As disclosed, the material supply introduces the carrier gas and semiconductor material into one end of the tubular permeable member, and the apparatus further includes another material supply that introduces the carrier gas and the semiconductor material into the other end of the tubular permeable member.

Different embodiments of the apparatus are disclosed as including a gas passage into which the semiconductor material is introduced as a powder for flow with the carrier gas. Certain embodiments of the material supply include a rotary screw and the gas passage into which the rotary screw introduces the semiconductor material, with one of these embodiments having the rotary screw rotating about a horizontal axis, and with another of these embodiments having the rotary screw rotating about a vertical axis. A further embodiment of the apparatus includes a vibratory feeder and the gas passage into which the vibratory feeder introduces a powder of the semiconductor material for flow with the carrier gas.

Each disclosed embodiment of the apparatus has the conveyor supporting the glass sheet substrate in a horizontally extending orientation so as to have downwardly and upwardly facing surfaces. One embodiment of the apparatus has the heated permeable member located above the conveyor to deposit the semiconductor layer on the upwardly facing surface of the glass sheet substrate. In addition, that embodiment is disclosed as including rolls that support the downwardly facing surface of the glass sheet substrate. Another embodiment of the apparatus has the conveyor constructed to include a gas hearth for supporting the glass sheet substrate in a generally horizontally extending orientation so as to have downwardly and upwardly facing surfaces. The heated permeable member of this latter embodiment is disclosed as being located below the glass sheet substrate to deposit the semiconductor layer on the downwardly facing surface of the glass sheet substrate.

Another object of the present invention is to provide an improved method for depositing a semiconductor material on a glass sheet substrate.

In carrying out the immediately preceding object, the method for depositing the semiconductor material is performed by heating a permeable member and by passing a carrier gas and a semiconductor material through the heated permeable member for heating to provide a vapor. A glass sheet substrate is conveyed adjacent the heated permeable member for deposition of the vapor on the glass sheet substrate as a semiconductor layer.

In the preferred practice of the method, an electrical voltage is applied across opposite ends of the permeable member which has a tubular shape into which the carrier gas and the semiconductor material are introduced for passage outwardly therethrough as the vapor that is deposited on the glass sheet substrate as the semiconductor layer.

The vapor is guided around the exterior of the tubular permeable member by a shroud and is passed outwardly through an opening in the shroud for the deposition on the glass sheet substrate as the semiconductor layer. The vapor may be passed outwardly from the shroud through a slit-shaped opening having opposite ends between which the opening has a varying size to control distribution of the deposition of the vapor on the glass sheet substrate as the semiconductor layer. Furthermore, the carrier gas and the semiconductor material are disclosed as both being introduced into opposite ends of the tubular permeable member.

Different practices of the method have the semiconductor material introduced as a powder into the carrier gas for flow to and through the heated permeable member. In one such practice of the method, the semiconductor powder is introduced into the carrier gas by a rotary screw, while another such practice of the method introduces the semiconductor powder into the carrier gas by a vibratory feeder.

As disclosed, the method is performed using a carrier gas that is helium.

Two different practices of the method are both performed by conveying the glass sheet substrate in a horizontally extending orientation so as to have downwardly and upwardly facing surfaces, with the vapor flowing downwardly for deposition of the semiconductor layer on the upwardly facing surface of the conveyed glass sheet substrate in one practice of the method, and with the vapor flowing upwardly for deposition of the semiconductor layer on the downwardly facing surface of the conveyed glass sheet substrate in the other practice of the method.

The objects, features and advantages of the present invention are readily apparent from the following detailed description of the best modes for carrying out the invention when taken in connection with the accompanying drawings.

BEST MODES FOR CARRYING OUT THE INVENTION

Figure 1:
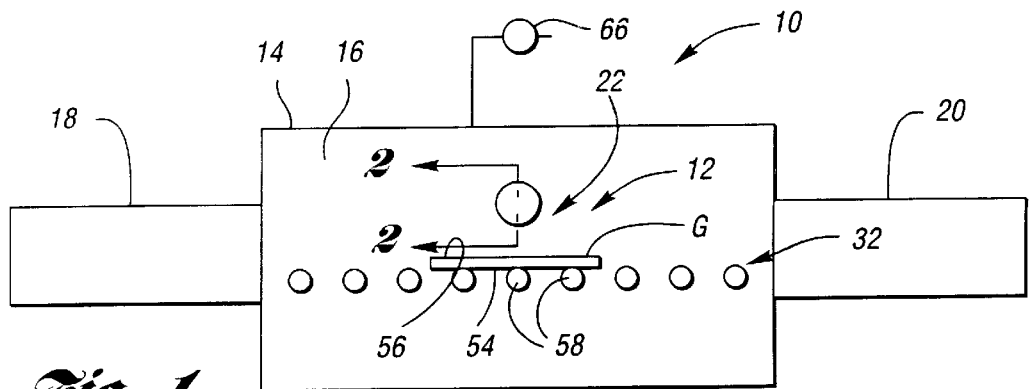
FIG. 1 is a schematic elevational view illustrating apparatus for depositing a semiconductor material on a glass sheet substrate in accordance with the present invention.

With reference to FIG. 1 of the drawings, a glass sheet processing system generally indicated by 10 includes apparatus 12 constructed according to the invention to perform the method of the invention. Both the apparatus 12 and the method for processing glass sheets G according to the invention will be hereinafter more fully described in an integrated manner to facilitate an understanding of the different aspects of the invention.

With continuing reference to FIG. 1, the system 10 includes a housing 14 defining a processing chamber 16 in which a semiconductor material is deposited on glass sheet substrates G. Housing 14 includes an entry station 18 and an exit station 20. These entry and exit stations 18 and 20 can be constructed as load locks or as slit seals through which the glass sheet substrates G enter and exit the processing chamber 16. The housing 14 is heated in any suitable manner such as disclosed by the aforementioned Foote et al. patents such that its processing chamber is maintained at a temperature of 500° to 700° C., and the glass sheet substrates are heated during the processing to a slightly lower temperature of about 400° to 650° C.

Figure 2:
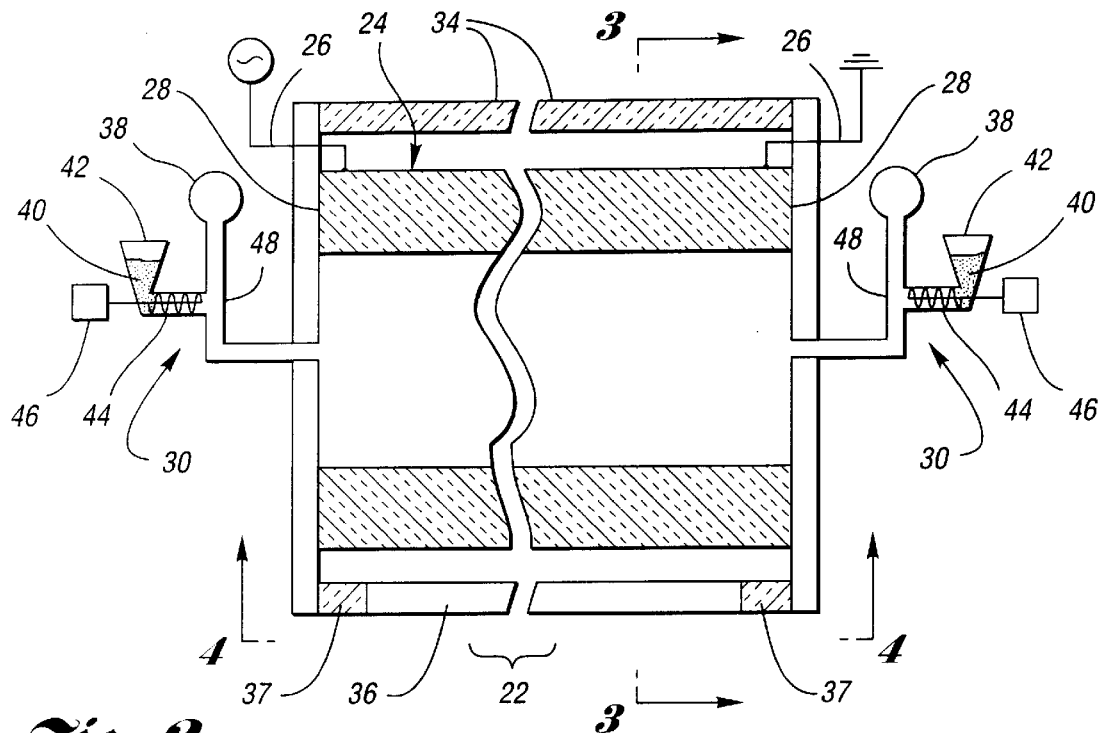
FIG. 2 is a partially broken-away sectional view taken through a distributor of the apparatus along the direction of line 2—2 in FIG. 1 and illustrates a pair of material supplies for introducing a carrier gas and a semiconductor material into opposite ends of a tubular permeable member.
Figure 3:
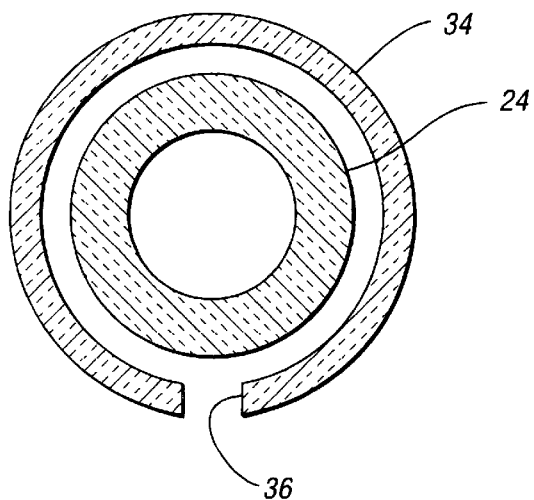
FIG. 3 is a sectional view through the distributor taken along the direction of line 3—3 in FIG. 2.

With continuing reference to FIG. 1 and additional reference to FIGS. 2 and 3, the apparatus 12 of the invention includes a distributor 22 having an electrically conductive permeable member 24 of a tubular shape having an elongated construction. The tubular permeable member 24 is heated, which as disclosed is performed by electrical connections 26 at its opposite ends 28 and application of a voltage along the length of the member. This voltage causes an electrical current to flow along the length of the tubular permeable member 24 so as to provide electrical heating thereof during the processing. This heating of the tubular permeable member 24 is to a temperature of about 850° to 1150° C. At least one material supply 30 of the apparatus 12 is provided for introducing a carrier gas and a semiconductor material into the tubular permeable member 24 for heating to provide a vapor that passes outwardly through the tubular permeable member during the processing. A conveyor 32 of the apparatus conveys a glass sheet substrate G adjacent the distributor 22 for deposition of the vapor on the substrate as a semiconductor layer.

Figure 4:
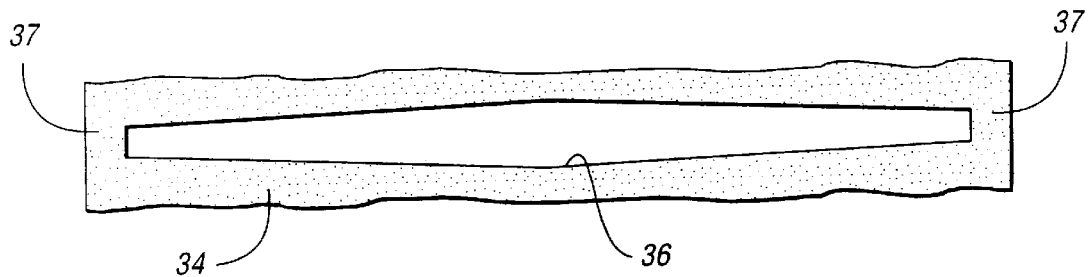
FIG. 4 is a bottom plan view taken along the direction of line 4—4 of FIG. 2 to illustrate a varying size slit opening of a shroud of the apparatus.

In the preferred construction of the apparatus 12, the tubular permeable member 24 is made of silicon carbide although it could also be made of permeable carbon or any other permeable material that is preferably electrically conductive to provide the heating in the manner disclosed. Furthermore, the distributor 22 preferably includes a shroud 34 of a generally tubular shape that receives the tubular permeable member 24 as best illustrated in FIG. 3. The shroud 34 guides the vapor around the exterior of the tubular permeable member 24 and has an opening 36 through which the vapor passes for the deposition of the semiconductor layer on the glass sheet substrate G. More specifically, the preferred construction of the shroud 36 has the opening 36 constructed as a slit that extends along the tubular shape of the shroud. The shroud 34 as shown in FIG. 4 has opposite ends 37 between which the slit-shaped opening 36 has a varying size which facilitates distribution of the vapor and uniform deposition of the semiconductor layer. More specifically, the slit-shaped opening 36 has a smaller size adjacent the ends 37 where the carrier gas and semiconductor material are introduced, as is hereinafter more fully described, and has a larger size at the central more remote area from that introduction so as to provide the uniform deposition. To provide good distribution of the semiconductor material, it may be desirable to provide the interior of the tubular permeable member 24 with a suitable diverter that provides a uniform passage of the vapor outwardly along the length of the tubular permeable member and then along the length of the slit-shaped opening 36 of the shroud. Furthermore, the shroud 34 is preferably made of a ceramic material that is most preferably mullite.

The shroud 34 also advantageously reduces radiant heat transfer from the hot tubular permeable member 24 to the glass sheet substrate G. More specifically, the amount of energy the shroud 34 radiates to the glass sheet substrate is reduced because its outside surface temperature is lower than that of the hot tubular permeable member 24. Mullite has an adequately low emissivity and is relatively strong and easy to fabricate. In addition, it should be appreciated that coatings can be provided to lower the emissivity of the outer surface of the shroud 34 such as $Al_2O_3$ or $Y_2O_3$.

It should also be noted that the length of the slit-shaped opening 36 of the shroud 34 can be selected to control the extent of the width of the deposited layer on the glass sheet substrate. Thus, the length of the split-shaped opening 36 can be selected to be less than the width of the glass sheet substrate to provide a strip of the deposited layer. Such control can also minimize waste of the vapors. When the entire width of the substrate is to be covered, one can ideally make the length of the slit-shaped opening 36 equal to or slightly less than the width of the substrate such that the substantially all of the vapors are deposited onto the substrate during the deposition.

In providing efficient deposition, the shroud 34 has been spaced from the conveyed glass sheet substrate a distance in the range of 0.5 to 3.0 centimeters. While greater spacings could be utilized, that would require lower system pressures and would result in vapor waste due to overspraying. Furthermore, smaller spacing could cause problems due to thermal warpage of the glass sheet substrate during conveyance.

As illustrated in FIG. 2, the material supply 30 introduces a carrier gas from a source 38 and a semiconductor material as a powder 40 from a hopper 42 into one end 28 of the tubular permeable member 24, and there is also another material supply 30 that likewise introduces a carrier gas and a semiconductor material as a powder into the other end 28 of the tubular permeable member 24. As such, there is a good distribution of the carrier gas and entrained semiconductor powder along the entire length of the tubular permeable member 24.

With continuing reference to FIG. 2, each of the material supplies 30 illustrated includes a rotary screw 44 that receives the semiconductor powder 40 from the hopper 42 and is rotatively driven by a suitable actuator 46. A passage 48 extends from the carrier gas source 38 to the adjacent end 28 of the porous tubular member 24 in communication with the rotary screw 44. Rotation of the screw 44 at a controlled rate introduces the semiconductor powder 40 into the passage 48 so as to be entrained therein for flow into the tubular permeable member 24 for the heating that provides the vapor.

Figure 5:
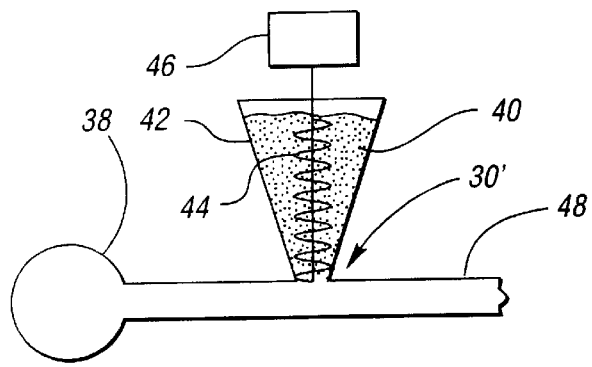
FIG. 5 is a view illustrating an alternate embodiment of the material supply which includes a rotary screw that rotates about a vertical axis as opposed to rotating about a horizontal axis as illustrated in FIG. 2.
Figure 6:
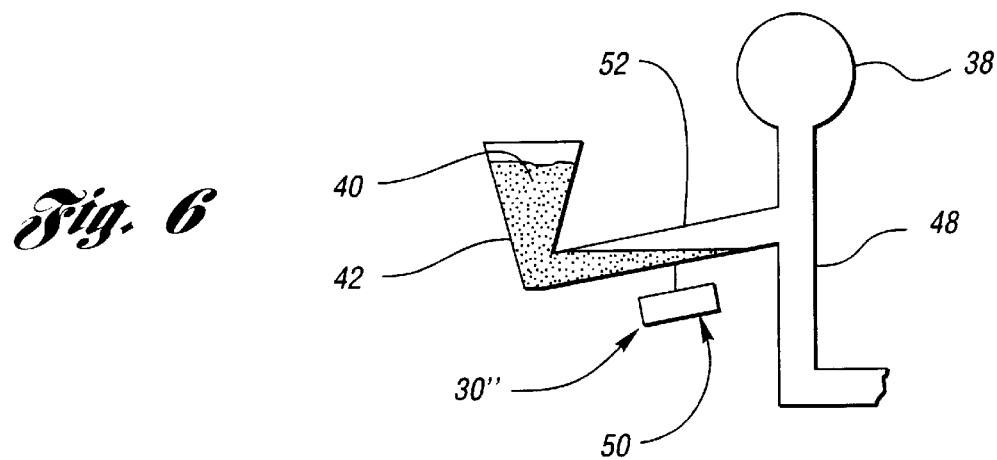
FIG. 6 is a view of a further embodiment of the material supply which includes a vibratory feeder.

FIGS. 2, 5 and 6 respectively disclose different embodiments of the material supplies 30, 30' and 30". More specifically, the embodiment of the material supply 30 illustrated in FIG. 2 has the screw 44 rotated about a horizontal axis for introduction of the semiconductor powder 40 into the carrier gas passage 48, while the FIG. 5 embodiment of the material supply 30' has the screw 44 rotated about a vertical axis for introduction of the semiconductor powder 40 from the hopper 42 into the carrier gas passage 48. With each of these screw embodiments of the material supplies, the amount of semiconductor material introduced as a powder can be accurately controlled by the rate of screw rotation. Furthermore, the FIG. 6 embodiment of the material supply 30" includes a vibratory feeder 50 having an inclined passage 52 extending upwardly from the hopper 42 to the carrier gas passage 48. Operation of the vibratory feeder 50 causes vibration of the semiconductor powder 40 which moves it upwardly along the inclined passage 52 to the carrier gas passage 48 for flow as an entrained powder into the tubular permeable member 24.

It should be appreciated that other types of material supplies can also be utilized for feeding the semiconductor powder including fluidized bed feeders and rotary disk feeders that are commercially available. The powder feed rate and the speed of conveyance of the glass sheet substrate directly control the film thickness such that the carrier gas flow rate, powder feed rate, and glass sheet conveyance speed all must be controlled. Also, starting and stopping of the powder feed can be utilized to commence and terminate the deposition of the semiconductor layer on the glass sheet substrate.

Figure 7:
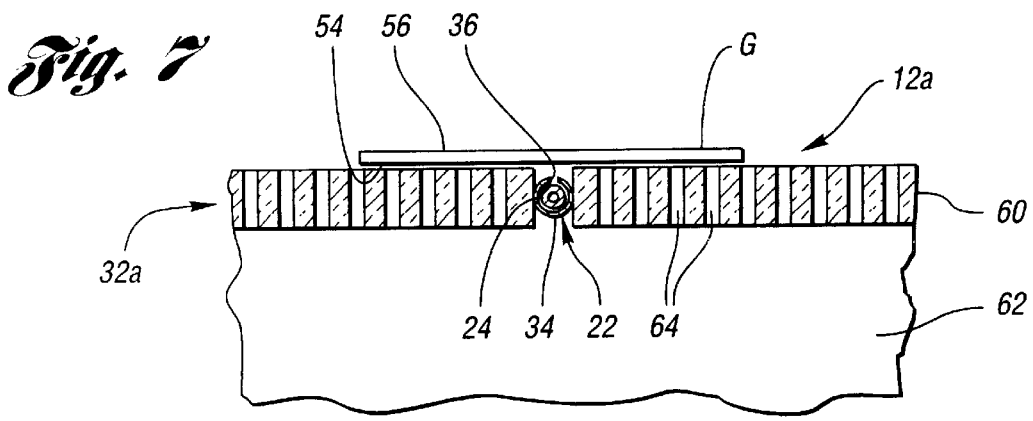
FIG. 7 is a view illustrating another embodiment where the semiconductor material is deposited on a downwardly facing surface of the conveyed glass sheet substrate as opposed to being deposited on an upwardly facing surface thereof as shown in FIG. 1.

Two different embodiments of the apparatus 12 and 12a respectively illustrated by FIGS. 1 and 7 both support the glass sheet substrate G in a horizontally extending orientation so as to have downwardly and upwardly facing surfaces 54 and 56.

In the embodiment of FIG. 1, the distributor 22 is located above the conveyor 32 so as to deposit the semiconductor layer on the upwardly facing surface 56 of the glass sheet substrate G. Furthermore, this embodiment of the apparatus discloses the conveyor 32 as being of the roll type including rolls 58 that support the downwardly facing surface 54 of the glass sheet substrate for its conveyance during the processing.

In the embodiment of FIG. 7, the apparatus 12a has the conveyor 32a constructed as a gas hearth for supporting the glass sheet substrate G for conveyance. More specifically, the gas hearth conveyor 32a includes a refractory hearth 60 above a plenum 62 of heated pressurized gas. Holes 64 in the hearth 60 provide for the upward flow of the pressurized heated gas so as to support the glass sheet substrate G in a floating manner. The hearth 60 in accordance with conventional construction can also include exhaust openings through which the gas escapes back downwardly through the hearth into a suitable return chamber that is not illustrated. In this gas hearth construction of the conveyor 32a, the distributor 22 is located below the glass sheet substrate G to deposit the semiconductor layer on its downwardly facing surface 54. Thus, the opening 36 provided by the slit in the shroud 34 is at the upper extremity of the distributor 22 in this embodiment, unlike the embodiment of FIG. 1 where the slit opening 36 is at the lower extremity of the shroud.

It should also be appreciated that the gas hearth conveyor can be utilized with a distributor located above the conveyed glass sheet substrate so as to provide the deposition on its upper surface as in the embodiment of FIG. 1 and unlike the embodiment of FIG. 7 which provides the deposition on the lower surface.

In performing the deposition, successful results have been achieved using cadmium telluride and cadmium sulfide as the semiconductor material. However, it should be appreciated that other semiconductor materials can be utilized including elements of Group IIB and Group VIA, as well as compounds including these elements, such as for example, zinc selenide, etc. and other materials that become semiconductors upon further processing. Also, dopants may be useful to enhance the deposition.

Use of the apparatus to perform the method of the invention has been performed with a vacuum drawn in the processing chamber 16 to about 1 to 50 Torr. In that connection, as illustrated in FIG. 1, the processing system 10 includes a suitable exhaust pump 66 for exhausting the processing chamber 16 of the housing 14 both initially and continuously thereafter to remove the carrier gas.

The carrier gas supplied from the source 38 is most preferably helium which has been found to increase the glass temperature range and the pressure range that provide good semiconductor characteristics such as dense deposition and good bonding. The carrier gas can also be another gas such as nitrogen, neon, argon or krypton, or combinations of these gases. It is also possible for the carrier gas to include a reactive gas such as oxygen that can advantageously affect growth properties of the semiconductor material. A flow rate of 0.3 to 10 standard liters per minute of the carrier gas has been determined to be sufficient to provide the semiconductor material flow to the distributor 22 for the deposition.

While the best modes for carrying out the invention have been described in detail, those familiar with the art to which the invention relates will appreciate other ways of carrying out the invention as defined by the following claims.

What is claimed is:

1. Apparatus for depositing a semiconductor material on a glass sheet substrate, comprising:

a heated permeable member;

a material supply for supplying a carrier gas and the semiconductor material for flow through the heated permeable member and passage therefrom as a vapor; and a conveyor for conveying a glass sheet substrate adjacent the heated permeable member for deposition of the vapor on the substrate as a semiconductor layer.

2. Apparatus for depositing a semiconductor material as in claim 1 wherein the heated permeable member has a tubular shape into which the material supply introduces the carrier gas and the semiconductor material for flow outwardly therefrom as the vapor that is deposited on the glass sheet substrate as the semiconductor layer.

3. Apparatus for depositing a semiconductor material as in claim 2 wherein the tubular permeable member has opposite ends across which an electric voltage is applied to provide its heating.

4. Apparatus for depositing a semiconductor material as in claim 3 wherein the tubular permeable member is made of silicon carbide.

5. Apparatus for depositing a semiconductor material as in claims 2, 3 or 4 further including a shroud of a generally tubular shape that receives the tubular permeable member, and the shroud having an opening through which the vapor passes for the deposition of the semiconductor layer on the glass sheet substrate as the semiconductor layer.

6. Apparatus for depositing a semiconductor material as in claim 5 wherein the opening of the shroud is a slit that extends along the tubular shape of the shroud.

7. Apparatus for depositing a semiconductor material as in claim 6 wherein the shroud has opposite ends between which the slit has a varying size.

8. Apparatus for depositing a semiconductor material as in claim 5 wherein the shroud is made of a ceramic material.

9. Apparatus for depositing a semiconductor material as in claim 8 wherein the ceramic material is mullite.

10. Apparatus for depositing a semiconductor material as in claim 2 wherein the material supply introduces the carrier gas and semiconductor material into one end of the tubular permeable member.

11. Apparatus for depositing a semiconductor material as in claim 10 further including another material supply that introduces the carrier gas and the semiconductor material into the other end of the tubular permeable member.

12. Apparatus for depositing a semiconductor material as in claim 1 wherein the material supply includes a rotary screw and a gas passage into which the rotary screw introduces a powder of the semiconductor material for flow with the carrier gas.

13. Apparatus for depositing a semiconductor material as in claim 12 wherein the rotary screw rotates about a horizontal axis.

14. Apparatus for depositing a semiconductor material as in claim 12 wherein the rotary screw rotates about a vertical axis.

15. Apparatus for depositing a semiconductor material as in claim 1 wherein the material supply includes a vibratory feeder and a gas passage into which the vibratory feeder introduces a powder of the semiconductor material for flow with the carrier gas.

16. Apparatus for depositing a semiconductor material as in claim 1 or 3 wherein the conveyor supports the glass sheet substrate in a horizontally extending orientation so as to have downwardly and upwardly facing surfaces, and the heated permeable member being located above the conveyor to deposit the semiconductor layer on the upwardly facing surface of the glass sheet substrate.

17. Apparatus for depositing a semiconductor material as in claim 16 wherein the conveyor includes rolls that support the downwardly facing surface of the glass sheet substrate.

18. Apparatus for depositing a semiconductor material as in claim 1 or 3 wherein the conveyor includes a gas hearth for supporting and conveying the glass sheet substrate in a generally horizontally extending orientation so as to have downwardly and upwardly facing surfaces.

19. Apparatus for depositing a semiconductor material as in claim 18 wherein the heated permeable member is located below the glass sheet substrate to deposit the semiconductor layer on the downwardly facing surface of the glass sheet substrate conveyed by the gas hearth.

20. Apparatus for depositing a semiconductor material on a glass sheet substrate, comprising:

a distributor including a tubular permeable member of silicon carbide having an elongated shape along which an electrical current flows to provide heating;

a pair of material supplies for introducing a carrier gas and an entrained powder of a semiconductor material into opposite ends of the tubular permeable member for heating to provide a vapor that passes outwardly through the tubular permeable member;

a shroud of a tubular shape that receives the tubular permeable member, and the shroud having an opening formed as a slit through which the vapor passes outwardly; and a conveyor for conveying a glass sheet substrate below the distributor for deposition of the vapor on the substrate as a semiconductor layer.

21. A method for depositing a semiconductor material on a glass sheet substrate, comprising:

heating a permeable member;

passing a carrier gas and a semiconductor material through the heated permeable member for heating to provide a vapor; and conveying a glass sheet substrate adjacent the heated permeable member for deposition of the vapor on the glass sheet substrate as a semiconductor layer.

22. A method for depositing a semiconductor material as in claim 21 wherein an electrical voltage is applied across opposite ends of the permeable member which has a tubular shape into which the carrier gas and the semiconductor material are introduced for passage is outwardly therefrom as the vapor that is deposited on the glass sheet substrate as the semiconductor layer.

23. A method for depositing a semiconductor material as in claim 22 wherein the vapor is guided around the exterior of the tubular permeable member by a shroud and is passed outwardly through an opening in the shroud for the deposition on the glass sheet substrate as the semiconductor layer.

24. A method for depositing a semiconductor material as in claim 23 wherein the vapor is passed outwardly from the shroud through a slit-shaped opening having opposite ends between which the opening has a varying size.

25. A method for depositing a semiconductor material as in claim 23 wherein the carrier gas and semiconductor material are both introduced into opposite ends of the tubular permeable member.

26. A method for depositing a semiconductor material as in claim 21 wherein the semiconductor material is introduced as a powder into the carrier gas for flow to and through the heated permeable member.

27. A method for depositing a semiconductor material as in claim 26 wherein the semiconductor powder is introduced into the carrier gas by a rotary screw.

28. A method for depositing a semiconductor material as in claim 26 wherein the semiconductor powder is introduced into the carrier gas by a vibratory feeder.

29. A method for depositing a semiconductor material as in claim 21, 22, 23 or 24 wherein the carrier gas is helium.

30. A method for depositing a semiconductor material as in claim 21, 22, 23 or 24 wherein the glass sheet substrate is conveyed in a horizontally extending orientation so as to have downwardly and upwardly facing surfaces.

31. A method for depositing a semiconductor material as in claim 30 wherein the vapor flows downwardly for deposition of the semiconductor layer on the upwardly facing surface of the conveyed glass sheet substrate.

32. A method for depositing a semiconductor material as in claim 21, 22, 23 or 24 wherein the glass sheet substrate is conveyed by a gas hearth in a generally horizontally extending orientation so as to have upwardly and downwardly extending surfaces, and the vapor flowing upwardly for deposition of the semiconductor layer on the downwardly facing surface of the conveyed glass sheet substrate.

* * * * *